(12) United States Patent
Forderhase et al.

(10) Patent No.: US 8,814,239 B2
(45) Date of Patent: Aug. 26, 2014

(54) TECHNIQUES FOR HANDLING MEDIA ARRAYS

(75) Inventors: Paul Forderhase, Austin, TX (US);
Julian Blake, Gloucester, MA (US);
William Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 253 days.

(21) Appl. No.: 13/397,441

(22) Filed: Feb. 15, 2012

(65) Prior Publication Data
US 2013/0209198 A1 Aug. 15, 2013

(51) Int. Cl.
*H01L 21/683* (2006.01)
*A47B 81/00* (2006.01)

(52) U.S. Cl.
USPC ............ 294/87.1; 294/213; 414/222.01

(58) Field of Classification Search
USPC ............ 294/87.1, 87.22, 87.24, 87.26, 103.1, 294/213, 902; 414/222.01, 816, 749.1, 414/749.6, 941; 74/490.01; 901/15
See application file for complete search history.

(56) References Cited

U.S. PATENT DOCUMENTS

| | | | | |
|---|---|---|---|---|
| 3,767,027 A * | 10/1973 | Pund et al. | ............ | 198/452 |
| 4,195,871 A * | 4/1980 | Chilton et al. | ............ | 294/16 |
| 6,209,707 B1 * | 4/2001 | Ronchi | ............ | 198/445 |
| 6,216,883 B1 * | 4/2001 | Kobayashi et al. | ............ | 414/941 |
| 6,464,445 B2 * | 10/2002 | Knapik et al. | ............ | 414/416.03 |
| 6,625,835 B1 * | 9/2003 | Frost et al. | ............ | 15/77 |
| 6,655,901 B2 * | 12/2003 | Tsubota et al. | ............ | 901/15 |
| 7,207,428 B2 * | 4/2007 | Huttner | ............ | 198/444 |
| 7,401,828 B2 * | 7/2008 | Yang | ............ | 294/119.1 |
| 8,585,115 B2 * | 11/2013 | Fairhurst et al. | ............ | 294/213 |
| 2001/0041118 A1 | 11/2001 | Martin et al. | | |
| 2007/0006406 A1 | 1/2007 | McEntee et al. | | |
| 2010/0178136 A1 * | 7/2010 | Ago | ............ | 74/490.01 |
| 2011/0182702 A1 * | 7/2011 | Hashimoto | ............ | 414/222.07 |

OTHER PUBLICATIONS

Fairhurst, John Robert, et al., Method and Apparatus for Lifting A Horizontally-Oriented Substrate from A Cassette, U.S. Appl. No. 13/268,129, filed Oct. 7, 2011.

International Search Report and Written Opinion, dated May 3, 2013 for PCT/US2013/024754 filed Feb. 5, 2013.

* cited by examiner

*Primary Examiner* — Paul T Chin

(57) ABSTRACT

Techniques for handling media arrays are disclosed. The techniques may be realized as a system for handling a plurality of substrates. The system may comprise a plurality of row elements for supporting the plurality of substrates, wherein the plurality of row elements may be operable to change configuration of the substrates from open configuration to a high-density configuration, where a distance between adjacent substrates in the open configuration may be greater than a distance between the adjacent substrates in the high-density configuration.

20 Claims, 14 Drawing Sheets

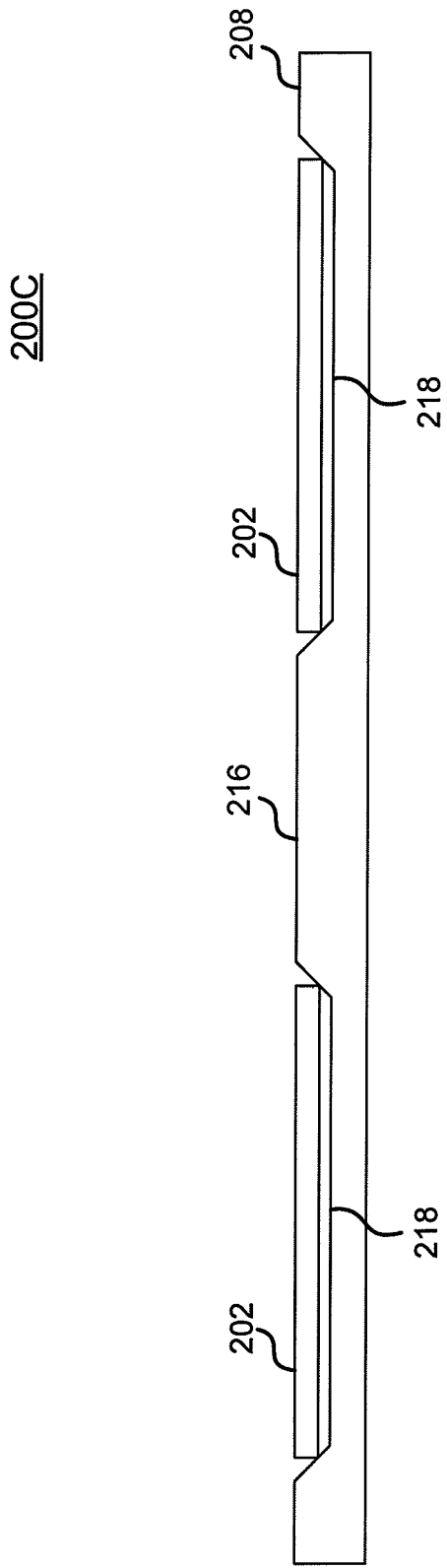

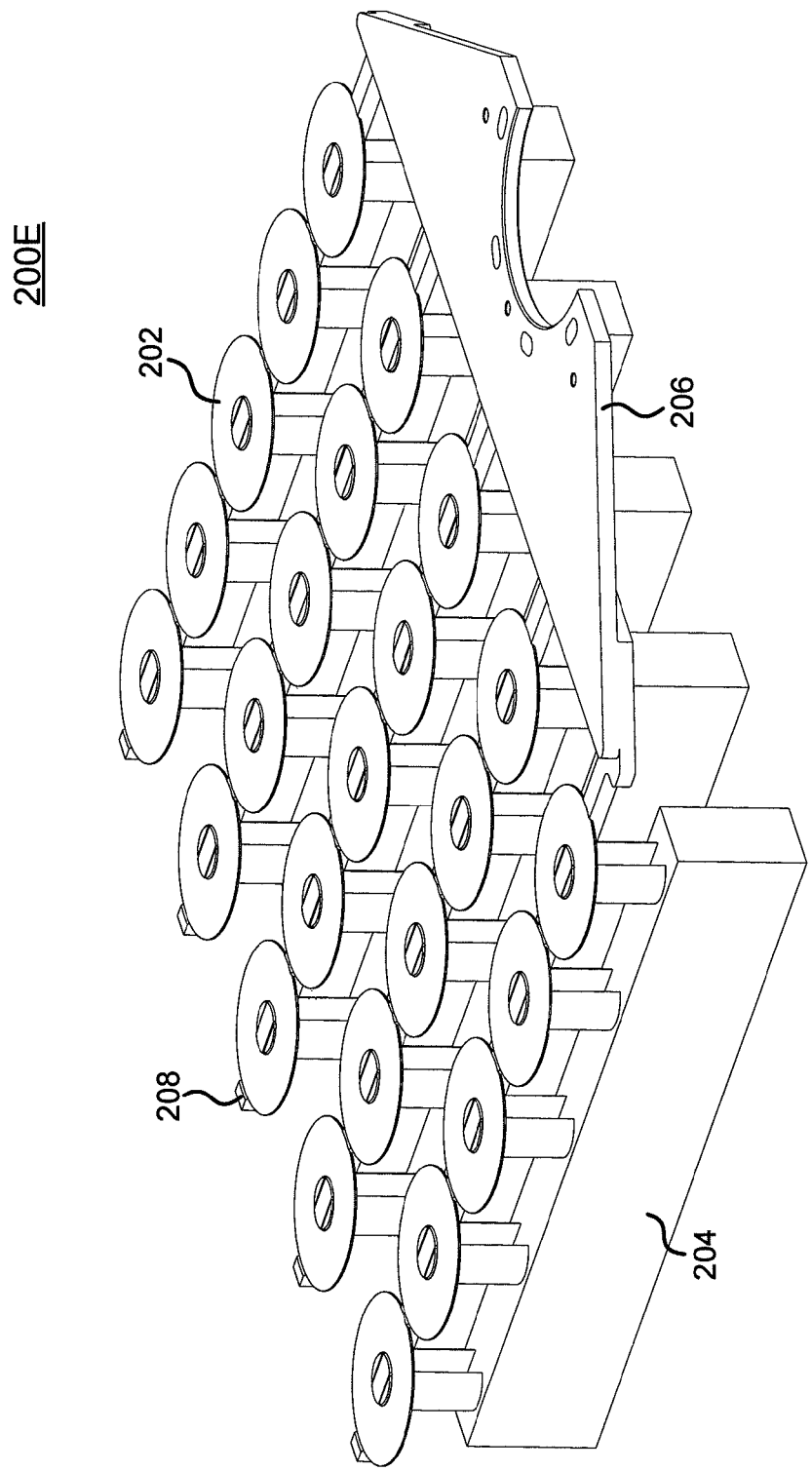

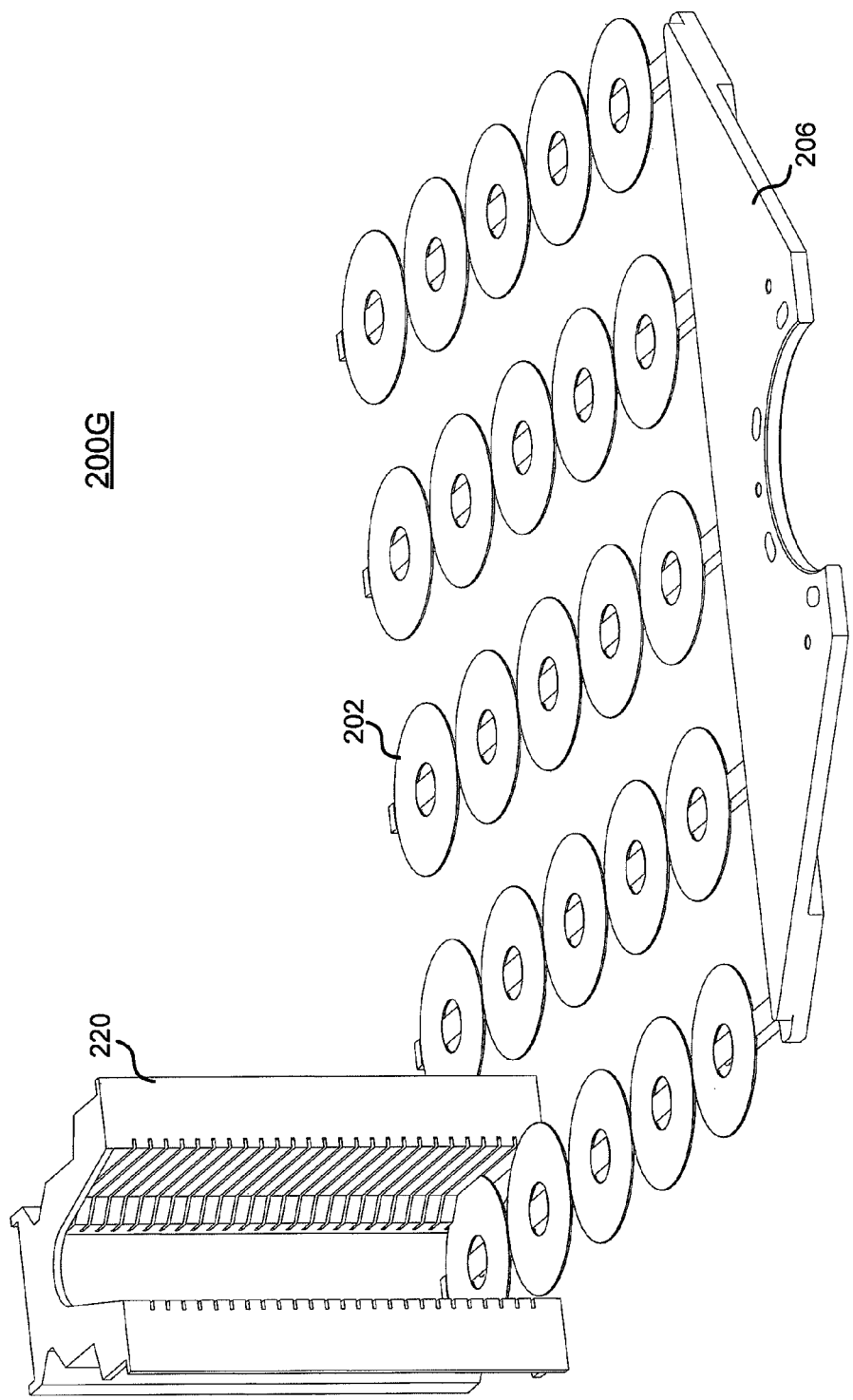

TECHNIQUES FOR HANDLING MEDIA ARRAYS

FIELD OF THE DISCLOSURE

The present disclosure relates generally to semiconductor manufacturing equipment and, more particularly, to techniques for handling media arrays used in ion implantation.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter a type and level of conductivity of target materials. Precise and efficient handling of integrated circuit (IC) substrates and their thin-film structures is often crucial for proper doping and performance.

FIG. 1 depicts a conventional ion implanter system 100. The ion implanter 100 includes a source power 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") each comprise multiple electrodes with a defined aperture to allow an ion beam 10 to pass therethrough. By applying different combinations of voltage potentials to the multiple electrodes, the D1 and D2 deceleration lenses can manipulate ion energies and cause the ion beam 10 to hit a target workpiece 114 at a desired energy. A number of measurement devices 116 (e.g., a dose control Faraday cup, a traveling Faraday cup, or a setup Faraday cup) may be used to monitor and control the ion beam conditions.

As described above, handling the target workpiece 114 is critical to successful ion implantation. Mishandling of the target workpiece 114 may result in damaged or improperly implanted workpiece that may be unusable, which may lead to a decrease in production and an increase in cost. As a result, traditional techniques may not provide both efficiency and precision in handling media arrays.

In view of the foregoing, it may be understood that there may be significant problems and shortcomings associated with current handling of media arrays.

SUMMARY OF THE DISCLOSURE

Techniques for handling media arrays are disclosed. In one particular exemplary embodiment, the techniques may be realized as a system for handling a plurality of substrates. The system may comprise a plurality of row elements for supporting the plurality of substrates, wherein the plurality of row elements may be operable to change configuration of the substrates from open configuration to a high-density configuration, where a distance between adjacent substrates in the open configuration may be greater than a distance between the adjacent substrates in the high-density configuration.

In accordance with other aspects of this particular exemplary embodiment, the plurality of row elements may comprise loop portions that glide along at least one gliding arm to form the high-density configuration.

In accordance with further aspects of this particular exemplary embodiment, the plurality of row elements may comprise loop portions that glide along at least one lateral gliding arm and at least one diagonal gliding arm to form the high-density configuration.

In accordance with additional aspects of this particular exemplary embodiment, each substrate may be a target substrate for at least one of ion implantation, deposition, etching, and annealing.

In accordance with other aspects of this particular exemplary embodiment, the high-density configuration may comprise at least one of a closed lateral configuration and a closed alternating configuration to optimize ion beam utilization and efficient handling of the plurality of the substrates.

In accordance with further aspects of this particular exemplary embodiment, the plurality of row elements may comprise a plurality of posts, wherein each of the plurality of posts comprises a ledge configured to hold the substrate and a relief portion configured to receive a transport arm of an end effector, and wherein the end effector is configured to move the plurality of transport arms into the relief portions of the posts to lift or place the plurality of the substrates.

In another particular exemplary embodiment, the techniques may be realized as an apparatus for processing a plurality of substrates. The apparatus may comprise a housing in which the plurality of substrates is processed. The apparatus may also comprise a substrate handling system configured to support the plurality of substrates and to change a configuration of the plurality of substrates from a high-density configuration to an open configuration, where a distance between adjacent substrates in the open configuration may be greater than a distance between the adjacent substrate in the high-density configuration.

In accordance with other aspects of this particular exemplary embodiment, the substrate handling system may comprise a plurality of row elements. In some embodiments, the plurality of row elements may comprise a plurality of posts. In some embodiments, each of the plurality of posts may comprise a post ledge configured to hold one of the plurality of substrates.

In accordance with further aspects of this particular exemplary embodiment, the substrate handling system may further comprise an end effector comprising a plurality of transport arms configured to transport the plurality of substrates to and from the plurality of row elements.

In accordance with additional aspects of this particular exemplary embodiment, each of the plurality of posts may comprise a relief portion configured to receive the transport arm of the end effector.

In accordance with other aspects of this particular exemplary embodiment, the substrate handling system may be configured to hold the plurality of substrates in the high-density configuration during processing of the substrates and configured to hold the plurality of substrates in the open configuration during a period outside of the processing of the substrates.

In accordance with further aspects of this particular exemplary embodiment, the plurality of row elements may be configured to change the configuration of the plurality of substrates from a high-density configuration to an open configuration.

In accordance with additional aspects of the this particular exemplary embodiment, the end effector may be configured to change a configuration of the plurality of substrates from a high-density configuration to an open configuration.

In accordance with other aspects of this particular exemplary embodiment, each of the plurality of substrates may comprise a process zone and an edge exclusion zone. In some embodiments, each of the transport arm may comprise a transport arm ledge, and the post ledge and the transport arm ledge may be configured to hold adjacent portions of the edge exclusion.

In accordance with further aspects of this particular exemplary embodiment, each of the plurality of substrates may comprise an inner edge and an outer edge. In some embodiments, the edge exclusion zone may comprise at least one of an inner edge exclusion zone and an outer edge exclusion zone.

In accordance with additional aspects of the this particular exemplary embodiment, the plurality of row elements may be operable to form the high-density configuration. In some embodiments, the high-density configuration comprises at least one of a closed lateral configuration and a closed alternating configuration to optimize ion beam utilization and efficient handling of the plurality of the substrates.

In accordance with other aspects of this particular exemplary embodiment, the plurality of row elements may comprise loop portions that glide along at least one gliding arm to form the high-density configuration. The at least one gliding arm may be a lateral gliding arm or a diagonal gliding arm.

In another particular exemplary embodiment, the techniques may be realized as a method for handling a plurality of substrates. The method may comprise receiving a plurality of substrates on a plurality of row elements in an open configuration. The method may also comprise repositioning the plurality of row elements into a closed configuration using at least one gliding arm coupled to a loop portion of the plurality of row elements.

In accordance with other aspects of this particular exemplary embodiment, the closed configuration may comprise at least one of a closed lateral configuration and a closed alternating configuration to optimize ion beam utilization and efficient handling of the plurality of substrates.

In accordance with further aspects of this particular exemplary embodiment, the at least one gliding arm may be a lateral gliding arm or a diagonal gliding arm.

In accordance with additional aspects of this particular exemplary embodiment, the media may be a magnetic bit-patterned media disk having a diameter of 65 millimeters.

In accordance with other aspects of this particular exemplary embodiment, receiving the plurality of substrates may further comprise receiving the plurality of substrates from a plurality of transport arms that move into relief portions of posts on the plurality of row elements, wherein the plurality of substrates rest on ledges of the posts of the plurality of row elements.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2C depicts a side view of a transport arm with media, according to an embodiment of the present disclosure.

FIG. 2E depicts a perspective view for handling media arrays, according to an embodiment of the present disclosure.

FIG. 2G depicts a perspective view for handling media arrays, according to an embodiment of the present disclosure.

DETAILED DESCRIPTION OF EXEMPLARY EMBODIMENTS

Reference will now be made in detail to exemplary embodiments, examples of which are illustrated in the accompanying drawings. It should be appreciated that the same reference numbers may be used throughout the drawings to refer to the same or like parts. It should also be appreciated that the following detailed description is exemplary and explanatory only and is not restrictive.

Embodiments of the present disclosure provide techniques for handling media arrays used in ion implantation. In addition, embodiments of the present disclosure provide various exemplary configurations for handling media arrays.

As described above, handling the target workpiece 114 is critical to successful ion implantation. The target workpiece 114 may be a single substrate or plurality of substrates. Large media arrays, each comprising a plurality of substrates, may be used for bulk ion implantation. Exposing a plurality of substrates to a single ion beam may be more efficient and may increase uniformity across the plurality of substrates during implantation. It is therefore important to be able to pack the large media arrays, and therefore the plurality of substrates, as closely as possible in order to minimize any wasted ion beam exposure. However, packing these large, and often bulky, media arrays may result in mishandling of the plurality of substrates, which are relatively thin. For example, the plurality of substrates on the large media arrays may touch, bump, scratch, or otherwise interfere with each other during implantation or transport. Damage or improperly implanted substrates may be unusable, which may lead to a decrease in production and an increase in cost. On the other hand, when the plurality of substrates are not packed closely enough, there may be inefficient ion beam utilization.

To solve the aforementioned problems associated with conventional techniques for handling media arrays, embodiments of the present disclosure provide various configurations for efficiently and precisely handling media arrays. For example, media arrays comprising a plurality of substrates may be packed tightly together to form a high-density configuration. In some embodiments, the media arrays may be brought together using robotic handling. Once the media arrays are brought together, these media arrays may be efficiently positioned in an ion implanter for implantation and removed from the ion implanter for further transport or processing. Forming a high-density configuration using precise handling of the media arrays may result in improved beam utilization and production.

Figure 1:
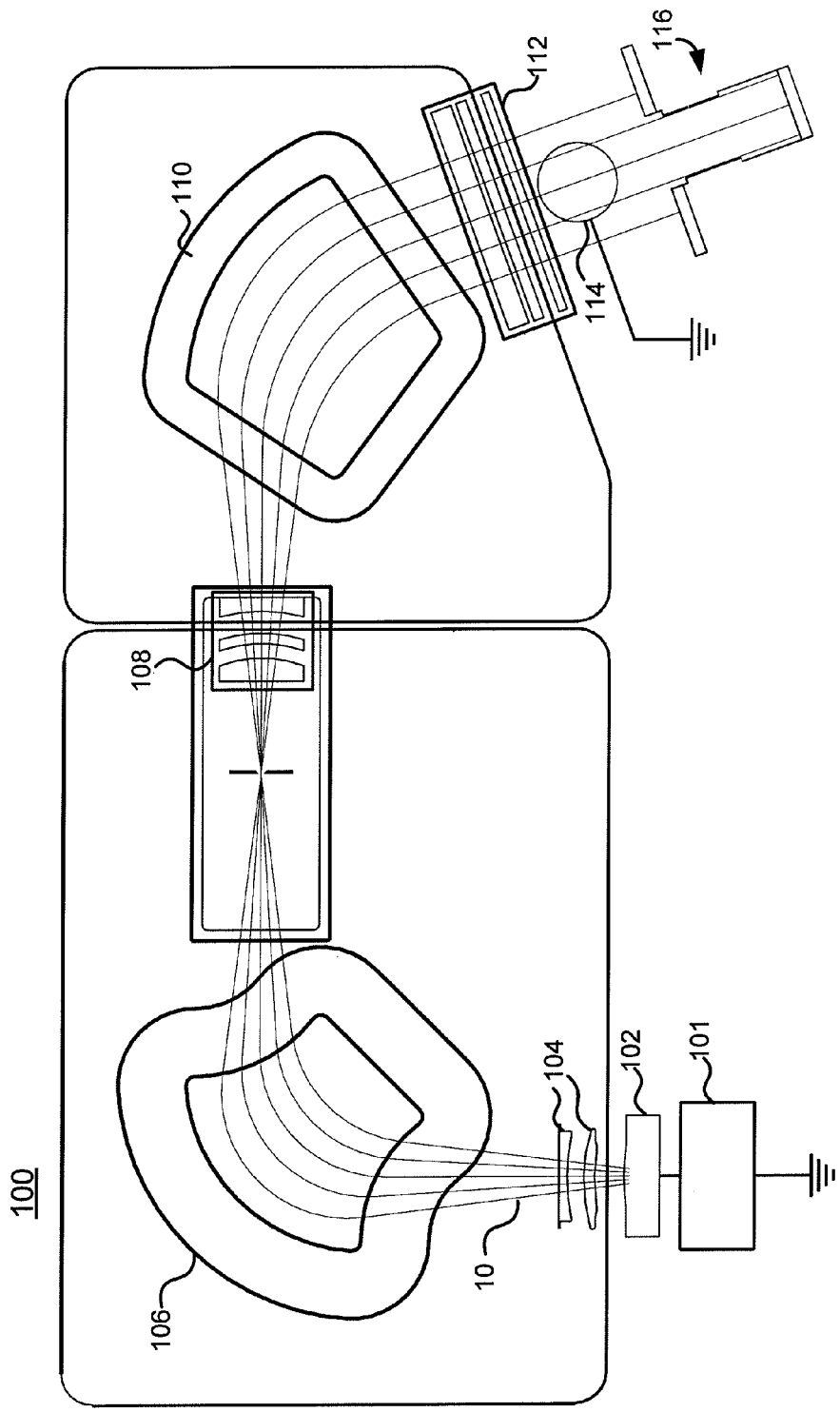
FIG. 1 depicts a conventional ion implantation system.
Figure 2A:
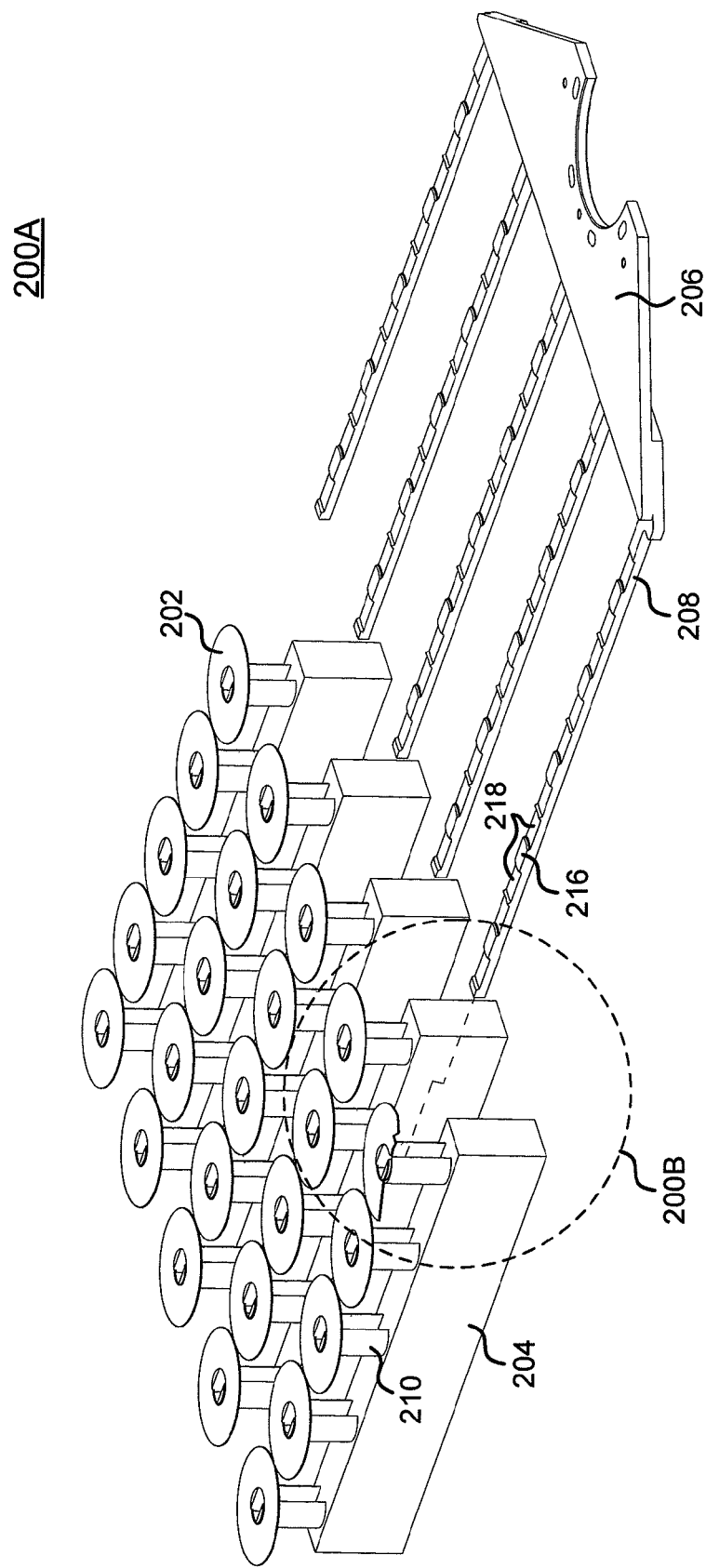
FIG. 2A depicts a perspective view for handling media arrays, according to various embodiments of the present disclosure.

FIG. 2A depicts a perspective view 200A for handling media arrays, according to various embodiments of the present disclosure. In this view 200A, a plurality of media 202 may sit on a plurality of row elements 204. An end effector 206 having a plurality of transport arms 208 may place or remove the plurality of media 202 on posts 210 located on the plurality of row elements 204. Each of the plurality of transport arms 208 may comprise a plurality of arm ledges 216 and a plurality of recesses 218, which may be used to hold and transport the plurality of media on the transport arms 208.

It should be appreciated that the plurality of media 202 may be positioned in an open configuration. An open configuration, as used herein, may refer to a configuration of the plurality of row elements 204 when receiving the plurality of media 202 from the plurality of transport arms 208. As depicted in FIGS. 2A-2G, the row elements may be spaced apart in an open configuration so that the plurality of media 202 in one row element 204 is not packed closely to the plurality of media 202 from an adjacent row element 204.

Figure 2B:
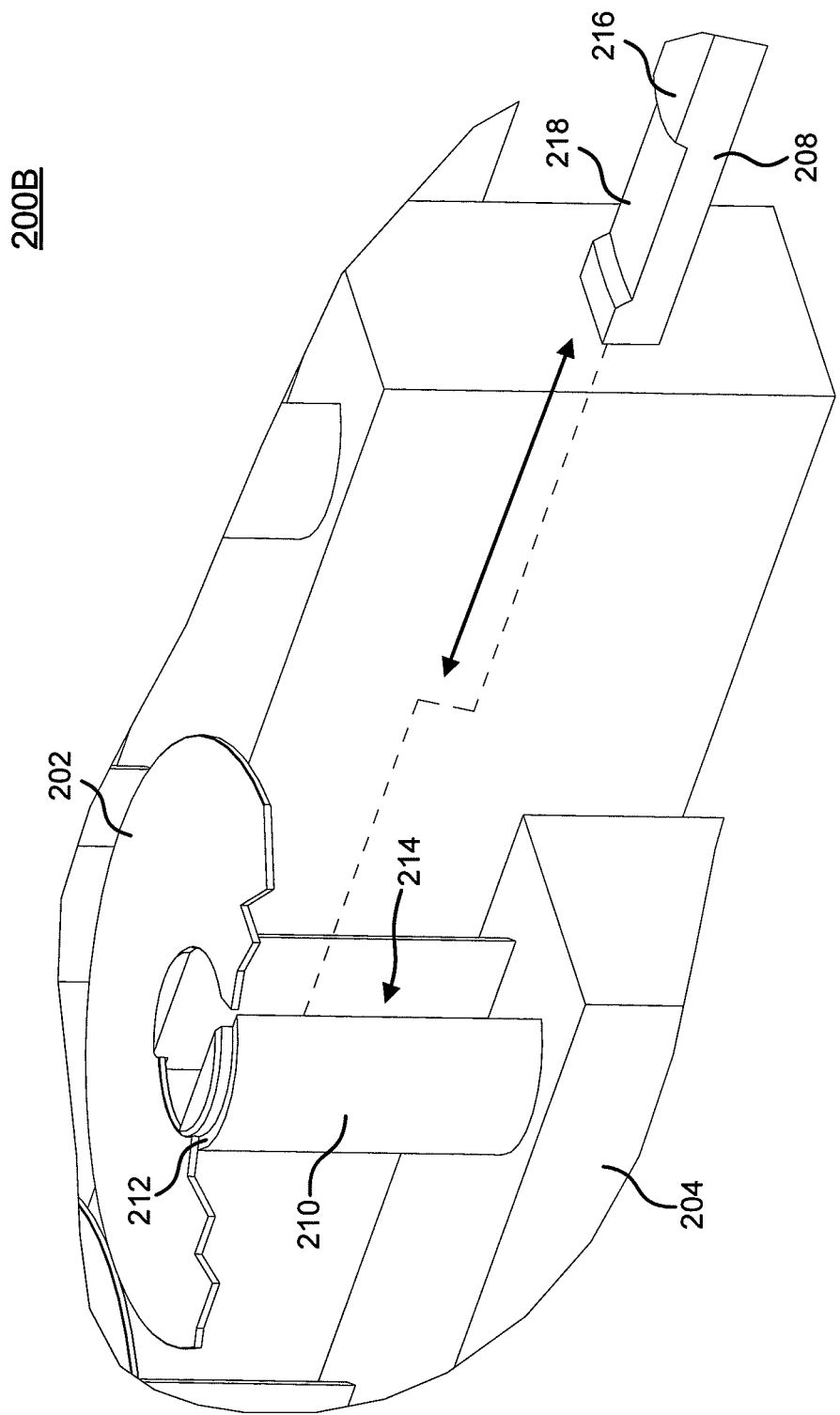
FIG. 2B depicts a detailed view for handling media arrays, according to an embodiment of the present disclosure.

FIG. 2B depicts a detailed view 200B for handling media arrays, according to an embodiment of the present disclosure. In this view 200B, the post 210, which is on the row element 204, may comprise a ledge 212. The media 202 may rest on a ledge 212 during ion implantation. By sitting on the ledge 212, there may be minimum contact to a bottom surface of the media 202.

The post 210 may also have a relief portion 214, which may allow the transport arm 208 to traverse through the post 210 to place and/or remove the media 202 from the posts 210 on the row elements. It should be appreciated that the plurality of transport arms 208 may move generally in a direction along the length the row elements 204 or in other directions, e.g., laterally, so that the transport arm 208 may line up to fit into the relief portion 214, as shown by the dotted lines.

Once the transport arm 208 enters the relief portion 214, the transport arms may be raised (if picking up the media 202 from the row elements 204) or let down (if placing down the media 202 on the row elements 204). While the media 202 is on the transport arms 208, it should be appreciated that the arm ledge 216 and recess 218 of the transport arm 208 may function similarly to the ledge 212 of the post 210 to allow the media 202 to rest with minimum or no contact to the bottom surface of the media 202.

FIG. 2C depicts a side view 200C of a transport arm 208 with media 202, according to an embodiment of the present disclosure. In this view 200C, the media 202 may rest on the transport arm 208 with little or no contact to a bottom surface of the media 202. As described above, the arm ledge 216 may fit within a center (hollow) portion of the media 202 (if the media 202 has a disk shape) so that the media 202 may rest on side areas of the recess portions 218. In some embodiments, the side areas of the recess portions 218 may be tapered, as shown. As a result, the media may rest with minimum or no contact between a bottom surface of the media 202 and the transport arm 208. It should be appreciated that in other embodiments, the side areas of the recess portions may be stepped or may have other configurations to minimize contact to the media 202.

The plurality of media 202 may be a variety of media. In some embodiments, the plurality of media 202 may be magnetic media patterned at a bit level (e.g., magnetic bit-patterned media) to increase higher storage density. The plurality of media 202 may also be circular or disk-shaped media that are less than or equal to 300 millimeters in diameter. For example, in some embodiments, the media 202 may be a magnetic bit-patterned media disk that may be 65 millimeters in diameter. It should be appreciated that while the plurality of media 202 of the present disclosure are directed to magnetic bit-patterned media disks, a variety of other media of various sizes, types, and shapes may also be provided.

It should be appreciated that each of the plurality of media 202 may comprise a process zone and at least one edge exclusion zone. The process zone may be the area of the media 202 in which implantation occurs. While the media 202 may rest on the post 210 and/or the transport arm 208 with minimum or no contact, as described above, the at least one edge exclusion zone may be the area of the media 202 in which the handling occurs. In some embodiments, the media 202 may comprise an inner edge exclusion zone and an outer exclusion zone, (e.g., for resting on the ledge 212 of the post 210 of the row element 204 and/or the arm ledge 216 and other portions of the transport arm 208).

It should be appreciated that the term "media," as used herein, may refer to any substance on which ion implantation occurs. Once ion implantation of the media takes place, the media may be used to provide storage. The term media, as used herein, may be used interchangeably with substrate, media, target, wafer, or disk, for example, semiconductor substrate, solar cells, light emitting diode (LED), data storage disk, etc.

Figure 2D:
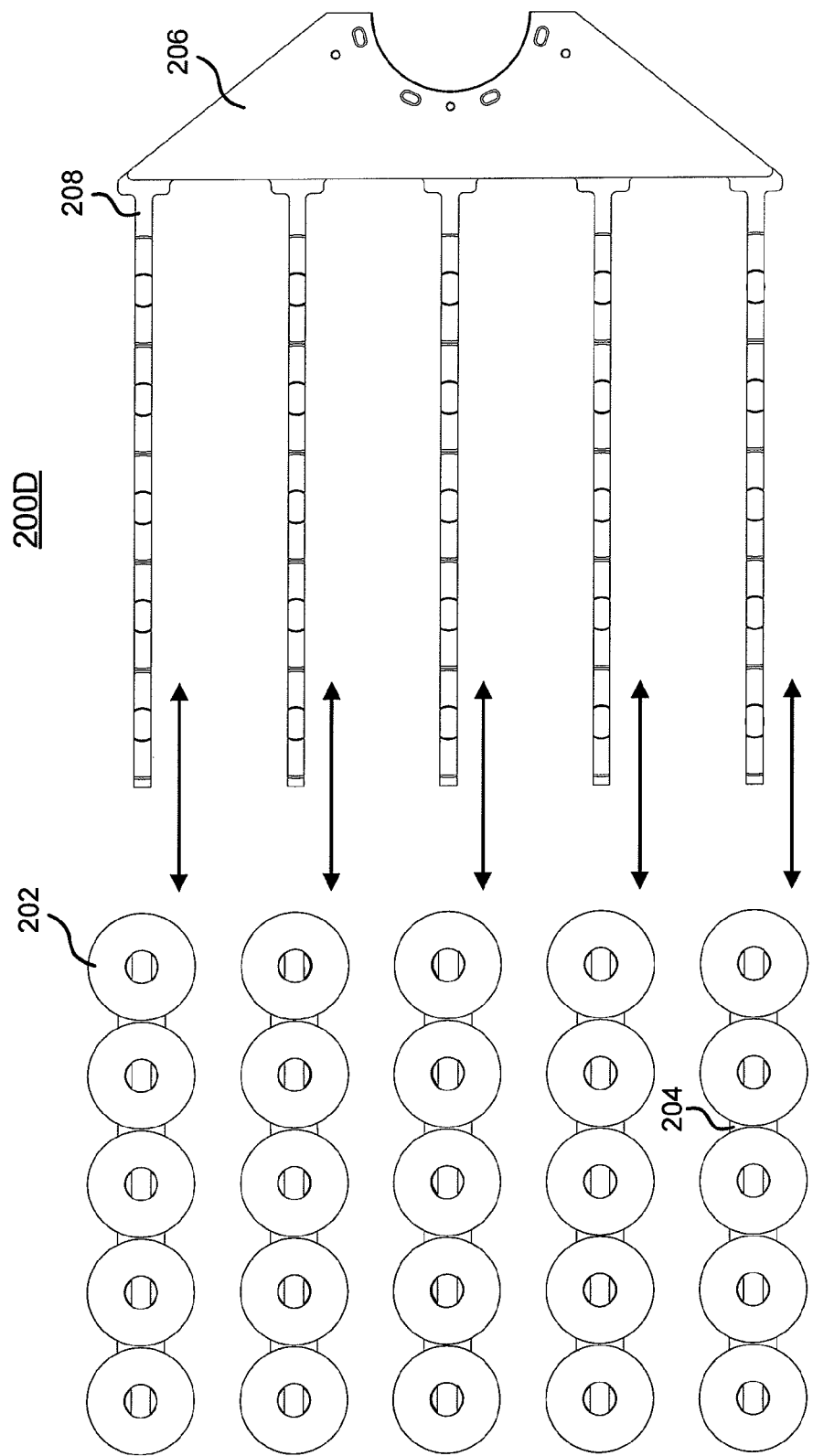
FIG. 2D depicts a perspective view for handling media arrays, according to an embodiment of the present disclosure.

FIG. 2D depicts a top view 200D for handling media arrays, according to an embodiment of the present disclosure. In this view 200D, the plurality of media 202 on the plurality of row elements 204 may be lined up with the plurality of transport arms 208, which may be connected to the end effector 206. The plurality of transport arms 208 may be configured to move in and out of the relief portion 214 of the posts 210, as described above with reference to FIG. 2B. In some embodiments, the plurality of transport arms 208 may place the plurality of media 202 on the plurality of posts 210, where they may be transported for ion implantation.

FIG. 2E depicts a perspective view 200E for handling media arrays, according to an embodiment of the present disclosure. In this view 200E, the plurality of transport arms 208 may move immediately under the plurality of media 202 via the relief portions 214 of the posts 210. In some embodiments, the plurality of transport arms 208 may bring the plurality of media 202 to the plurality of row elements 204 and rest the plurality of media 202 on the plurality of posts 210 for ion implantation. In some embodiments, the plurality of transport arms 208 may lift and remove the plurality of media 202 from the plurality of posts 210 (e.g., after ion implantation) and transport the plurality of media 202 for storage and/or other mode of transportation.

Figure 2F:
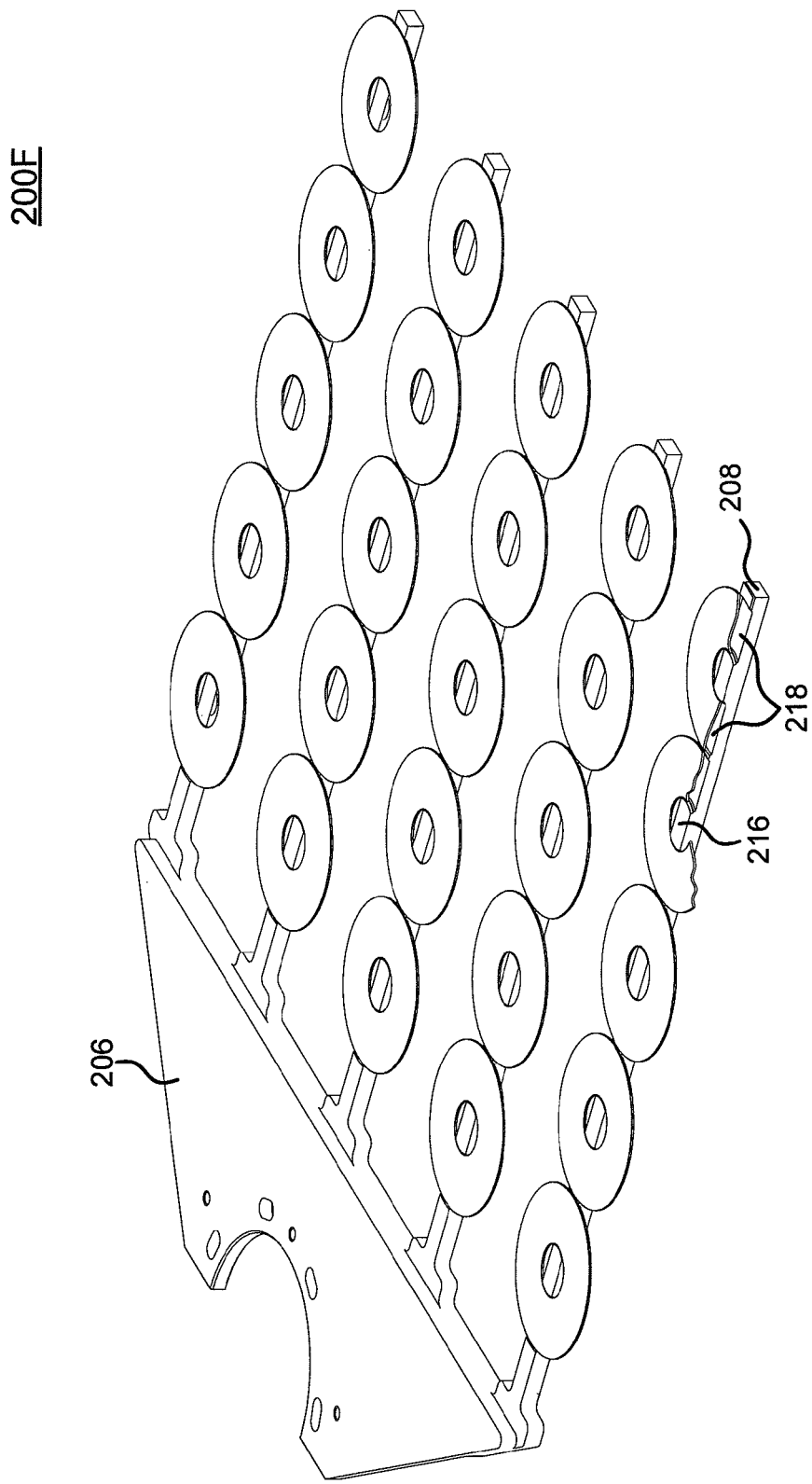
FIG. 2F depicts a side view for a transport arm for handing media arrays, according to an embodiment of the present disclosure.

FIG. 2F depicts a perspective view 200F for handling media arrays, according to an embodiment of the present disclosure. In this view 200F, the plurality of media 202 may rest on the plurality of transport arms 208. As described above, the media 202 may sit on the arm ledge 216 so that a bottom face of the media 202 is above a main surface of the recess portions 218 of transport arms 208.

FIG. 2G depicts a perspective view 200G for handling media arrays, according to an embodiment of the present disclosure. The end effector 206, which in some embodiments may be controlled robotically, may move the plurality of media 202 and place them in a cassette 220. The cassette 220 may provide a way for the plurality of media 202 to be transported without significant contact to each other or any other surface. For example, the cassette 220 may provide slots that make minimal contact at edges of the media 202. In some embodiments, the cassette 220 may provide a way to efficiently store and protect the plurality of media 202. The cassette 220 may provide additional techniques for transport and/or processing of the plurality of media 202.

In FIGS. 2A-2G, the row elements 204, the plurality of transport arms 208, the end effector 206, and the cassette 220 may be used to handle, move, and/or manipulate the plurality of media 202. In some embodiments, the plurality of media 202 may be robotically handled by any of the plurality of row elements 204, transport arms 208, the end effector 206, and the cassette 220, and manipulate the media 202 for ion implantation.

For the reasons discussed above, distance between and configuration of each of the row elements 204 may be variable. For example, the plurality of row elements 204 may be brought in from an open configuration to form one or more high-density configurations. It should be appreciated that a high-density configuration, as used herein, may refer to any configuration where the plurality of media 202 are packed more closely together than in an open configuration. As described above, an open configuration may allow the plurality of media 202 on the plurality of row elements 204 to be spaced apart, generally to allow for transport or manipulation without any interference. However, for implantation, an open configuration for the plurality of media 202 may result in inefficient ion beam utilization. On the other hand, a high-density configuration for the plurality of media 202 may reduce the space between the plurality of media 202. In other words, a distance between adjacent substrates in the high-density configuration may be lesser than a distance between the adjacent substrates in the open configuration, thus allowing more targets per area, and therefore providing greater efficiency ion beam utilization during implantation.

Figure 3A:
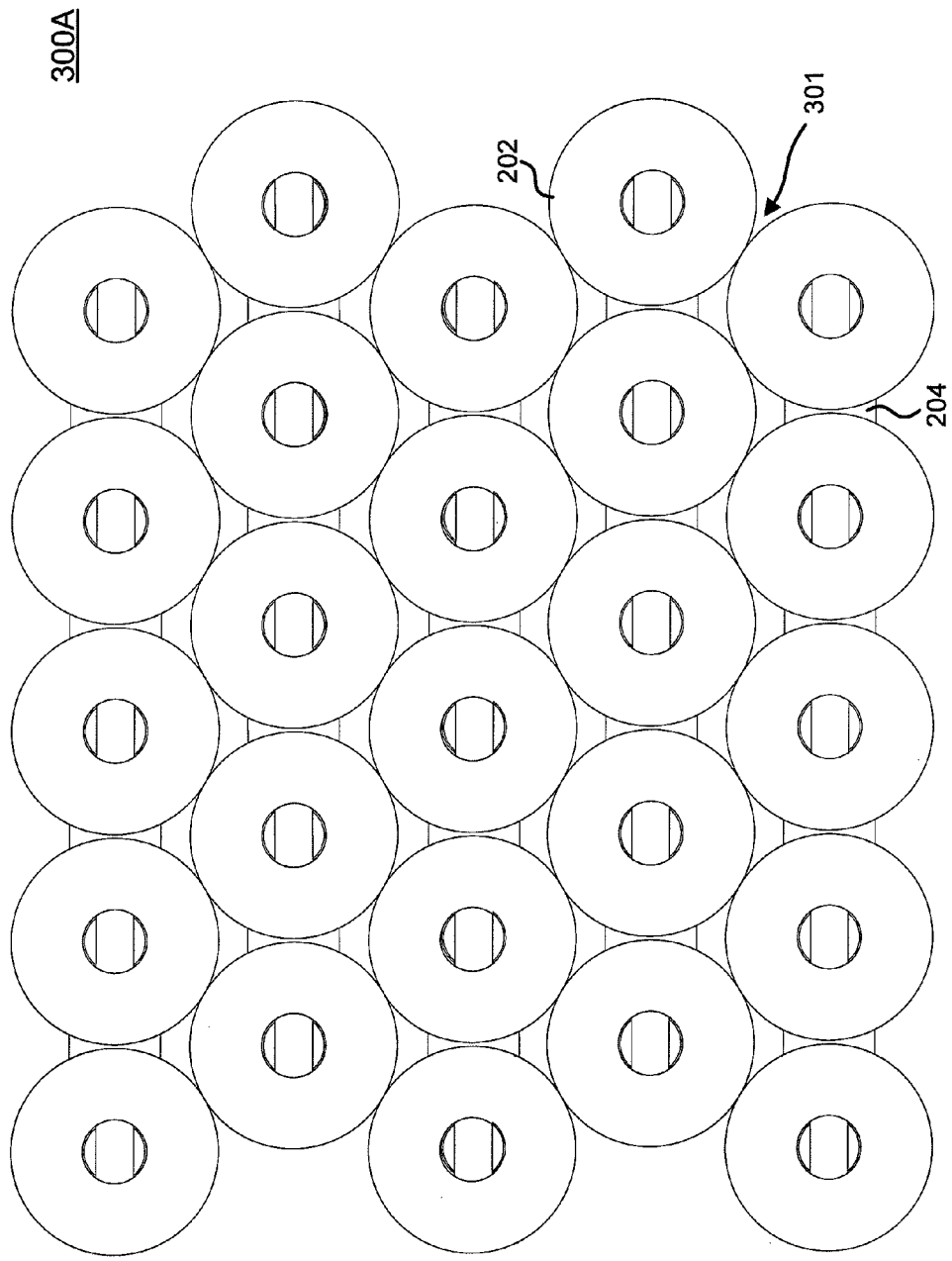
FIG. 3A depicts a top view of a media array configuration, according to an embodiment of the present disclosure.

FIG. 3A depicts a top view 300A of a media array configuration, according to an embodiment of the present disclosure. In this view 300A, a plurality of media 202 may be on a plurality of row elements 204. To minimize the spacing between the plurality of media 202, and therefore optimize utilization of an ion beam during implantation, the plurality of row elements may be positioned and configured so that the plurality of media 202 is packed together closely to form a high-density array. For example, in some embodiments, the plurality of row elements 204 may be positioned closer together so that each of the plurality of media 202 on one row element 202 may come in contact with or come close in contact with each of the plurality of media 202 on an adjacent row element 204 at two points. In other words, the plurality of row elements 204 may be configured to place the plurality of media 202 in an alternating pattern, as shown in view 300A. In this configuration, a space or pitch 301 between the plurality of media 202 on adjacent row elements 204 may be minimized or entirely eliminated. The space or pitch 301 may be small or non-existent when the plurality of media 202 is in an alternating pattern. This may allow optimum utilization of an ion beam during ion implantation.

Figure 3B:
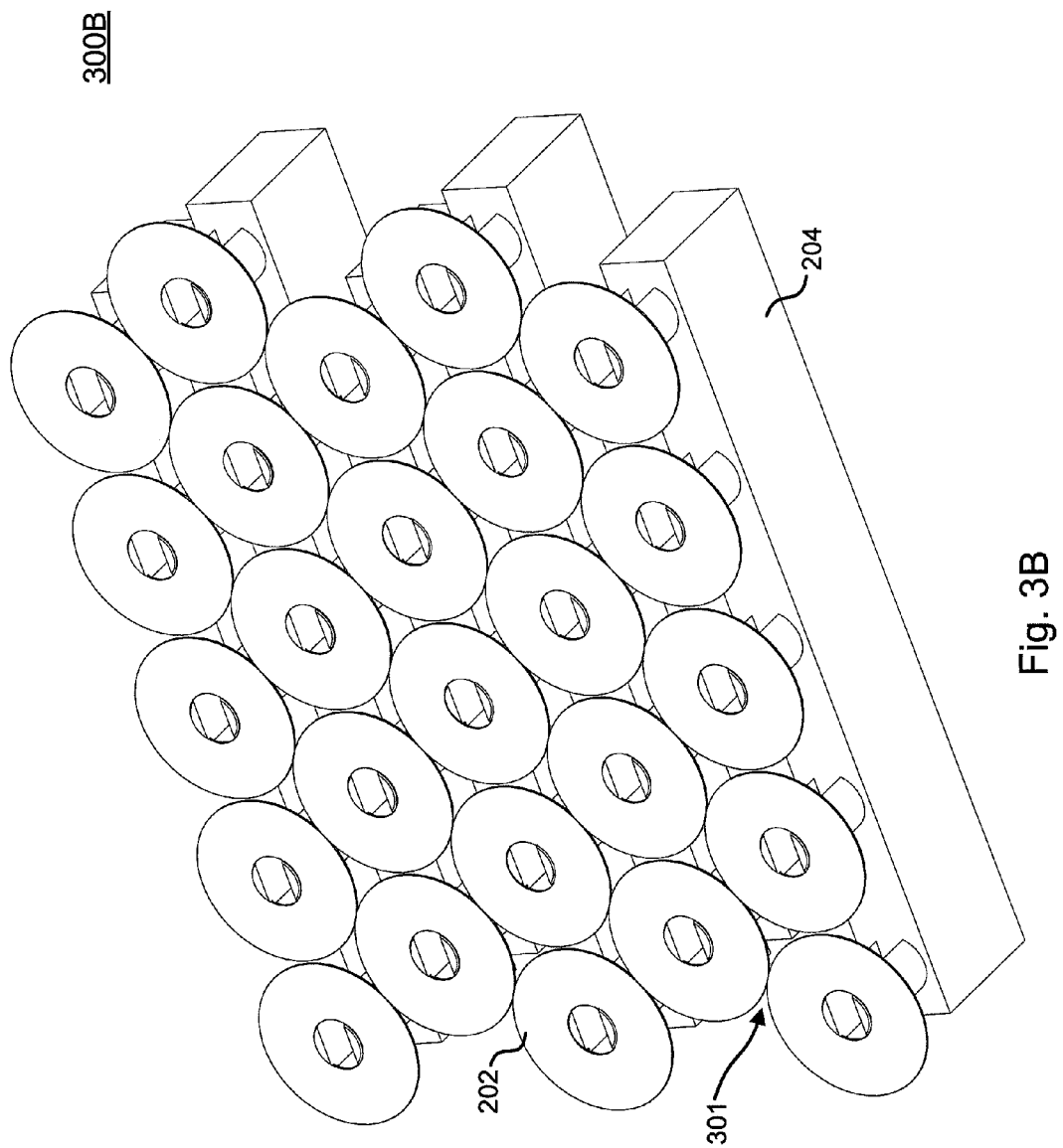
FIG. 3B depicts a perspective view of a media array configuration, according to an embodiment of the present disclosure.

FIG. 3B depicts a perspective view 300B of a media array configuration, according to an embodiment of the present disclosure. Similar to view 300A, in this view 300B, the plurality of row elements 204 may be positioned and configured so that the plurality of media 202 is packed together closely to form a high-density array. The alternating pattern or configuration of the plurality of row elements 204 may be more easily seen in this view 300B.

Figure 4A:
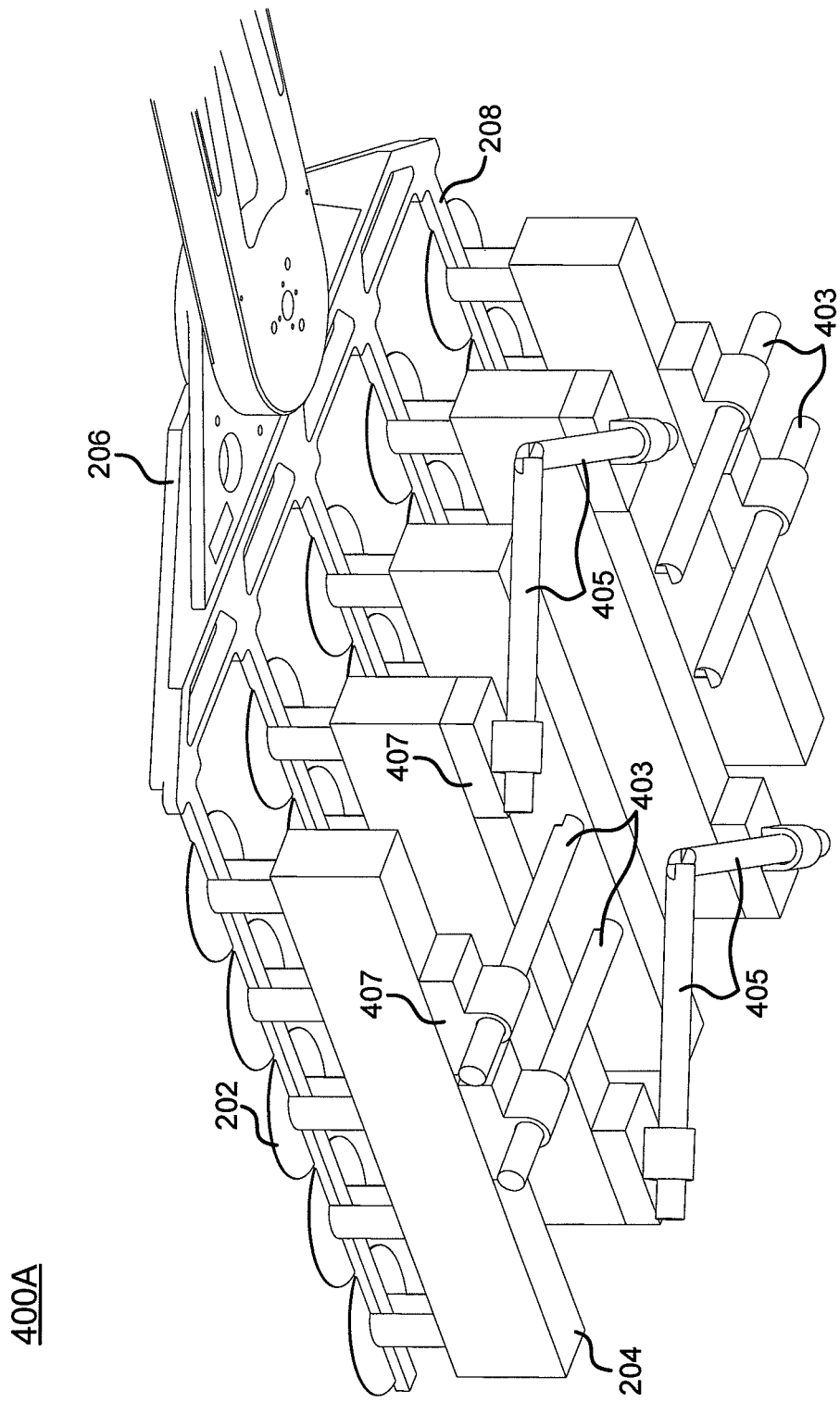
FIG. 4A depicts a bottom perspective view of a media array configuration using row elements with gliding arms, according to an embodiment of the present disclosure.

FIG. 4A depicts a bottom perspective view 400A of a media array configuration using row elements with gliding arms, according to an embodiment of the present disclosure. In this view 400A, lateral gliding arms 403 and diagonal gliding arms 405 may be used to move the plurality of row elements 204 to a position or configuration that maximizes ion beam utilization for the plurality of media 202. For example, each row element 204 may have loop portions 407 configured to allow lateral gliding arms 403 and/or diagonal gliding arms 405 to move in and out of the loop portions 407. In some embodiments, the lateral gliding arms 403 and diagonal gliding arms 405 may be fixed to allow the row elements 204 to move in a direction along the length of the gliding arms 403 and 405. It should be appreciated that the end effector 206 may initially retract the plurality of transport arms 208 away from the plurality of row elements 204 before the gliding arms 403 and 405 move or position the plurality of row elements 204 to a high-density array configuration.

Figure 4B:
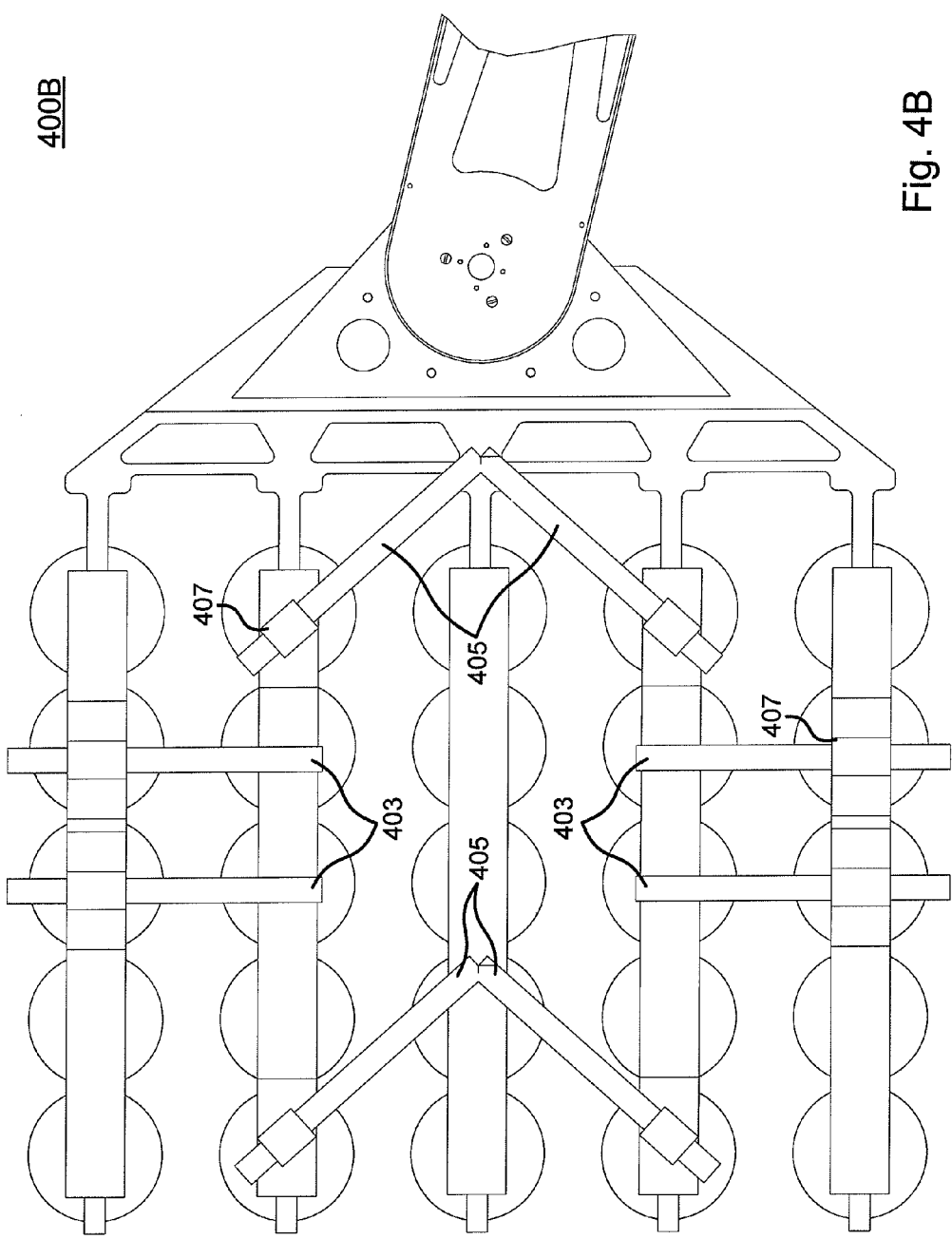
FIG. 4B depicts a bottom view of a media array configuration using row elements with gliding arms, according to an embodiment of the present disclosure.

FIG. 4B depicts a bottom view 400B of a media array configuration using row elements with gliding arms, according to an embodiment of the present disclosure. In this view 400B, the plurality of row elements 204 may be coupled to the lateral gliding arms 403 and/or diagonal gliding arms 405 via the loop portions 407, which allow the plurality of row elements 204 to glide along shaft portions of the gliding arms 403 and 405 for repositioning or reconfiguration (e.g., into a high density array configuration).

Figure 4C:
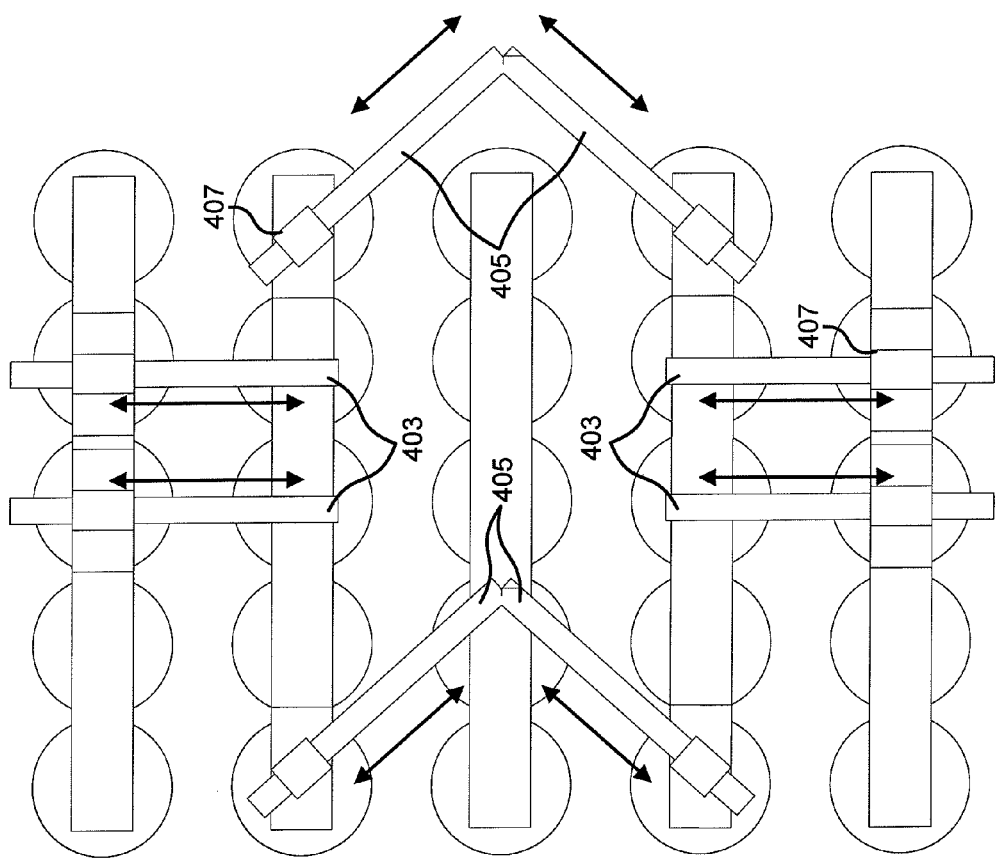
FIG. 4C depicts a bottom view of an open media array configuration, according to an embodiment of the present disclosure.

FIG. 4C depicts a bottom view 400C of an open media array configuration, according to an embodiment of the present disclosure. In this view 400C, the open media array configuration may allow the plurality of row elements 204 to be separated as far as possible. For example, the plurality of row elements 204 are at far ends of the lateral gliding arms 403 and the far ends of the diagonal gliding arms 405. Arrows in the view 400C represent directions that each of the plurality of row elements may traverse along the lateral gliding arms 403 and/or diagonal gliding arm 405.

Figure 4D:
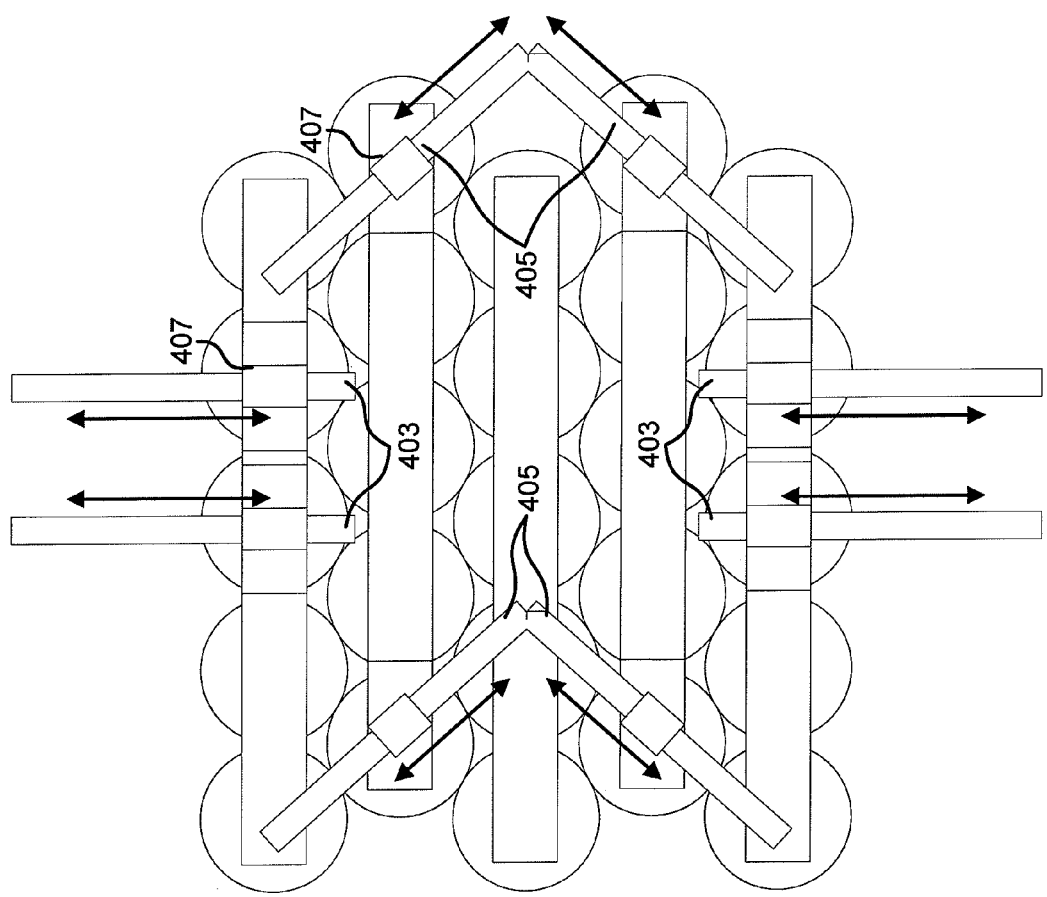
FIG. 4D depicts a bottom view of a closed media array configuration, according to an embodiment of the present disclosure.

FIG. 4D depicts a bottom view 400D of a closed media array configuration, according to an embodiment of the present disclosure. In this view 400D, the plurality of row elements 204 may be brought together so that the plurality of media 202 may be packed as closely as possible, similar to that shown in FIG. 3A. For example, the plurality of row elements 204 may be moved along the arrows so that the plurality of row elements 204 are no longer at far ends of the lateral gliding arms 403 and the far ends of the diagonal gliding arms 405. This allows the plurality of row elements 204 to form a closed media array configuration, in which the plurality of media is as tightly packed as possible. It should be appreciated that the end effector may also be configured to change the configuration of the plurality of substrates from a high-density configuration to an open configuration.

As described above, media arrays that are packed tightly together may form a high-density configuration. An advantage of forming the high-density configuration may include efficient handling and positioning of media in and out of an ion implanter. Forming a high-density configuration according to embodiments described above may also provide secure and protected media arrays (e.g., little or no contact to other items). Another advantage of the high-density array may be improved beam utilization and production.

It should be appreciated that other various configurations may also be provided. For example, rather than an alternating pattern or configuration, where the row elements are staggered, a closed lateral configuration may be provided. In a closed lateral configuration, the media arrays may be brought laterally closer to each other. While this pattern or configuration may not pack the plurality of media as closely together as possible when compared to the alternating or staggered configuration, this laterally closer configuration may be easier to achieve. For example, such a configuration may only use lateral gliding arms or other similar lateral movement techniques. This configuration may be simpler from a mechanical standpoint, which may result in greater overall production efficiency, despite not more efficiently using an ion beam.

It should be appreciated that while embodiments of the present disclosure are directed to using a 5×5 media array configuration, a greater or lesser number of media and/or media patterns, arrangements, or configurations may also be provided. For example, each row element 204 may comprises a greater or lesser number of posts 210 to hold the media 202. The cassette 220 may also be configured to hold a greater or lesser number of media 202 than depicted.

It should also be appreciated that while embodiments of the present disclosure are directed towards semiconductor manufacturing and/or ion implantation, other implementations, systems, and/or modes of operation may also be provided.

It should further be appreciated that the disclosed embodiments not only provide several modes of operation, but that these various modes may provide additional implantation customizations that would not otherwise be readily provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A system for handling a plurality of substrates, the system comprising:
a plurality of row elements, disposed adjacent to one another, for supporting the plurality of substrates, wherein each of the row elements comprises a plurality of posts, each post holding a respective substrate, and wherein the plurality of row elements are operable to change configuration of the substrates from an open configuration to a high-density configuration, wherein a distance between substrates disposed on adjacent row elements in the open configuration is greater than a distance between the substrates disposed on the adjacent row elements in the high-density configuration.

2. The system of claim 1, wherein the plurality of row elements further comprise loop portions that glide along at least one gliding arm to form the high-density configuration.

3. The system of claim 1, wherein the plurality of row elements further comprise loop portions that glide along at least one lateral gliding arm and at least one diagonal gliding arm to form the high-density configuration.

4. The system of claim 1, wherein each substrate is a target substrate for at least one of ion implantation, deposition, etching, and annealing.

5. The system of claim 1, wherein the high-density configuration comprises at least one of a closed lateral configuration and a closed alternating configuration to optimize ion beam utilization and efficient handling of the plurality of the substrates.

6. The system of claim 1, wherein each of the plurality of posts comprises a ledge configured to hold the substrate and a relief portion configured to receive a transport arm of an end effector, and wherein the end effector is configured to move the plurality of transport arms into the relief portions of the posts to lift or place the plurality of the substrates.

7. An apparatus for processing a plurality of substrates, the apparatus comprising:
a substrate handling system comprising:
a plurality of row elements, each comprising:
a plurality of posts, wherein each of the plurality of posts comprises a post ledge configured to hold one of the plurality of substrates,
wherein said substrate handling system is configured to support the plurality of substrates and to change a configuration of the plurality of substrates from a high-density configuration to an open configuration, wherein distance between adjacent substrates in the open configuration is greater than a distance between the adjacent substrate in the high-density configuration; and
an end effector comprising a plurality of transport arms configured to transport the plurality of substrates to and from the plurality of row elements;
wherein each of the plurality of posts further comprises a relief portion configured to receive the transport arm of the end effector.

8. The apparatus of claim 7, wherein the substrate handling system is configured to hold the plurality of substrates in the high-density configuration during processing of the substrates and configured to hold the plurality of substrates in the open configuration during a period outside of the processing of the substrates.

9. The apparatus of claim 7, wherein the plurality of row elements is configured to change the configuration of the plurality of substrates from a high-density configuration to an open configuration.

10. The apparatus of claim 7, wherein the end effector is configured to change a configuration of the plurality of substrates from a high-density configuration to an open configuration.

11. The apparatus of claim 7, wherein each of the plurality of substrates comprises a process zone and an edge exclusion zone, wherein each of the transport arm comprises a transport arm ledge, and wherein the post ledge and the transport arm ledge are configured to hold adjacent portions of the edge exclusion.

12. The apparatus of claim 11, wherein each of the plurality of substrates comprises an inner edge and an outer edge, and wherein the edge exclusion zone comprises at least one of an inner edge exclusion zone and an outer edge exclusion zone.

13. The apparatus of claim 7, wherein the plurality of row elements is operable to form the high-density configuration, wherein the high-density configuration comprises at least one of a closed lateral configuration and a closed alternating configuration to optimize ion beam utilization and efficient handling of the plurality of the substrates.

14. The apparatus of claim 7, wherein the plurality of row elements further comprise loop portions that glide along at least one gliding arm to form the high-density configuration, wherein the at least one gliding arm is a lateral gliding arm or a diagonal gliding arm.

15. A method for handling and processing a plurality of substrates, comprising:
   receiving a plurality of substrates on a plurality of row elements in an open configuration;
   repositioning the plurality of row elements into a closed configuration;
   processing the plurality of substrates while in the closed configuration;
   repositioning the plurality of row elements into the open configuration after the processing; and
   removing the plurality of substrates from the row elements while in the open configuration.

16. The method of claim 15, wherein the closed configuration comprises at least one of a closed lateral configuration and a closed alternating configuration to optimize ion beam utilization and efficient handling of the plurality of substrates.

17. The method of claim 15, wherein said repositioning is performed using at least one gliding arm coupled to a loop portion of the plurality of row elements, and wherein the at least one gliding arm is a lateral gliding arm or a diagonal gliding arm.

18. The method of claim 15, wherein receiving the plurality of substrates further comprises:
   receiving the plurality of substrates from a plurality of transport arms that move into relief portions of posts on the plurality of row elements, wherein the plurality of substrates rest on ledges of the posts of the plurality of row elements.

19. The method of claim 18, wherein removing the plurality of substrates further comprises:
   moving the plurality of transport arms into the relief portions of the posts on the plurality of row elements; and
   lifting the plurality of substrates from the ledges of the posts with the plurality of transport arms.

20. The method of claim 15, wherein the processing comprising an action selected from the group consisting of ion implantation, deposition, etching, and annealing.

\* \* \* \* \*